(12) United States Patent
Park (10) Patent No.: US 7,928,488 B2
(45) Date of Patent: Apr. 19, 2011

(54) UNIT PIXELS, IMAGE SENSOR CONTAINING UNIT PIXELS, AND METHOD OF FABRICATING UNIT PIXELS

(75) Inventor: Byung-Jun Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/285,437

(22) Filed: Oct. 6, 2008

(65) Prior Publication Data

US 2009/0090937 A1    Apr. 9, 2009

(30) Foreign Application Priority Data

Oct. 5, 2007    (KR) .................... 10-2007-0100459

(51) Int. Cl.
*H01L 31/062* (2006.01)
*H01L 31/113* (2006.01)
(52) U.S. Cl. .................. 257/294; 257/291; 257/292
(58) Field of Classification Search .................. 257/291, 257/292, 294
See application file for complete search history.

(56) References Cited

U.S. PATENT DOCUMENTS

| 2006/0169870 A1 | 8/2006 | Silsby et al. |
| 2007/0153337 A1* | 7/2007 | Kim .............................. 358/482 |
| 2008/0237761 A1* | 10/2008 | Fu et al. ........................ 257/432 |

FOREIGN PATENT DOCUMENTS

| JP | 3759435 | 1/2006 |
| KR | 1020060116458 | 11/2006 |
| KR | 1020070035202 | 3/2007 |

* cited by examiner

*Primary Examiner* — Thien F Tran
(74) *Attorney, Agent, or Firm* — Harness, Dickey & Pierce, P.L.C.

(57) ABSTRACT

Example embodiments provide a unit pixel, an image sensor containing unit pixels, and a method of fabricating unit pixels. The unit pixel may include a semiconductor substrate, photoelectric transducers formed within the semiconductor substrate, multi-layered wiring layers formed on a frontside of the semiconductor substrate, inner lenses formed on a backside of the semiconductor substrate corresponding to the photoelectric transducers, and microlenses formed above the inner lenses.

24 Claims, 7 Drawing Sheets

UNIT PIXELS, IMAGE SENSOR CONTAINING UNIT PIXELS, AND METHOD OF FABRICATING UNIT PIXELS

This application claims priority under 35 U.S.C. §119 to Korean Patent Application No. 10-2007-0100459 filed on Oct. 5, 2007 in the Korean Intellectual Property Office, the entire contents of which are incorporated herein by reference.

BACKGROUND

1. Field

Example embodiments are directed to unit pixels, an image sensor containing unit pixels, and method of fabricating unit pixels, and, more particularly, to unit pixels with improved photosensitivity, an image sensor containing unit pixels with improved photosensitivity, and a method of fabricating unit pixels with improved photosensitivity.

2. Description of the Related Art

Image sensors may be semiconductor elements that convert an optical image into an electrical signal. Image sensors may be categorized into charge coupled devices (CCDs) and complementary metal-oxide-semiconductor (CMOS) image sensors.

A CCD may have a structure in which each MOS capacitor is more closely located and charges are stored in the MOS capacitor and transferred to a target. A CMOS image sensor may employ CMOS technology that uses a control circuit and a signal-processing circuit as peripheral circuits, and may adopt a switching mode that detects outputs sequentially.

Generally, CMOS image sensors may be divided into an active pixel sensor (APS) array and a logic region, which may also be referred to as a peripheral circuit region. The APS array may sense light and generate electrical signals, and the logic region may process electrical signals generated by the APS array. The APS array may include a photoelectric transformation element that senses light and converts the light into electrical signals. An increased surface area of a photoelectric transformation element, such as a photodiode for example, may improve the photosensitivity of an image sensor.

As the integration density of a CMOS image sensor increases, the area of an APS region may be increased to a degree. In response, a microlens may be employed to change the path of light incident on an area other than a photodiode, and the light may be focused onto the photodiode.

However, even with the use of a microlens within an image sensor for condensing light, light incident obliquely onto the microlens may not reach a photoelectric transformation element. Thus, the amount of incident light reaching the photoelectric transformation element may be reduced, and the photosensitivity of the image sensor may be reduced.

SUMMARY

Example embodiments provide unit pixels that may provide improved photosensitivity by reducing loss of light incident on a photoelectric transformation element.

Example embodiments also provide an image sensor containing the unit pixels.

Example embodiments also provide a method of fabricating the unit pixels.

A unit pixel may comprise a semiconductor substrate, a photoelectric transducer within the semiconductor substrate, multi-layered wiring layers on a frontside of the semiconductor substrate, an inner lens corresponding to the photoelectric transducer on a backside of the semiconductor substrate, and a microlens above the inner lens.

The semiconductor substrate may be patterned to form the inner lens.

The inner lens may be convexly curved away from the backside of the semiconductor substrate.

The semiconductor substrate may include an epitaxial layer.

A doped high concentration ion implantation layer may be along the backside of the semiconductor substrate.

An anti-reflective layer may be on the inner lenses.

A planarizing layer may be between the inner lens and the microlens.

A color filter layer corresponding to the photoelectric transducers may be between the inner lens and the microlens.

A method of fabricating unit pixels may comprise providing a semiconductor substrate, forming a photoelectric transducer within the semiconductor substrate, forming wiring layers with a multi-stacked structure on a frontside of the semiconductor substrate, forming an inner lens corresponding to the photoelectric transducer on a backside of the semiconductor substrate, and forming a microlens above the inner lens.

The semiconductor substrate may include a bulk substrate and an epitaxial layer.

A portion of the backside of the semiconductor substrate may be ground after forming the wiring layers. The backside of the semiconductor substrate may be ground so that only the epitaxial layer remains on the semiconductor substrate.

Forming the inner lenses may comprise forming at least one hemispherical mask pattern corresponding to the photoelectric transducer on the backside of the semiconductor substrate, and transferring the at least one hemispherical mask patterns to the backside of the semiconductor substrate.

Forming the at least one hemispherical mask pattern may comprise forming a mask layer on the backside of the semiconductor substrate, patterning the mask layer to form at least one mask pattern corresponding to the photoelectric transducer, and reflowing the at least one mask pattern.

Forming the inner lens may comprise performing anisotropic etching on the backside of the semiconductor substrate with no etching selectivity between the at least one hemispherical mask pattern and the semiconductor substrate.

A doped high concentration ion implantation layer may be formed along the backside of the semiconductor substrate after forming the inner lens.

An anti-reflective layer may be formed on the inner lens.

A planarizing layer may be formed between the inner lens and the microlens.

A color filter layer corresponding to the photoelectric transducer may be formed between the inner lens and the microlens.

An image sensor may comprise an active pixel array including a plurality of unit pixels, and a logic region. The plurality of unit pixels may be arranged in two dimensions.

The logic region may comprise a timing generator, a row decoder, a row driver, a correlated double sampler, an analog to digital converter, a latch, and a column decoder, wherein the timing generator is configured to provide timing and control signals to the row decoder and the column decoder, wherein the row driver is configured to provide a plurality of driving signals to the active pixel array, wherein the correlated double sampler is configured to receive an electrical signal from the active pixel array, sample the electrical signal, and output an analog signal, wherein the analog to digital converter is configured to convert the analog signal outputted by the correlated double sampler into a digital signal and output the digital signal, and wherein the latch is configured to latch the digital signal output by the analog to digital converter and output the latched signal according to a signal from the column decoder.

The plurality of driving signals may include a pixel select signal, a reset signal, and a charge transfer signal.

BRIEF DESCRIPTION OF THE DRAWINGS

The above and other features and advantages of example embodiments will become more apparent by describing them with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
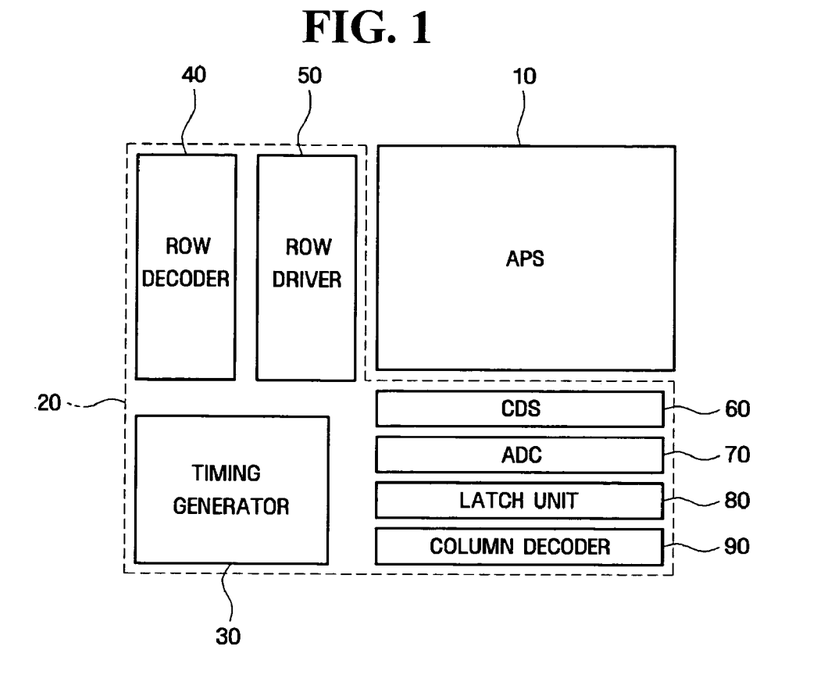
FIG. 1 is a block diagram of an image sensor according to example embodiments.
Figure 2:
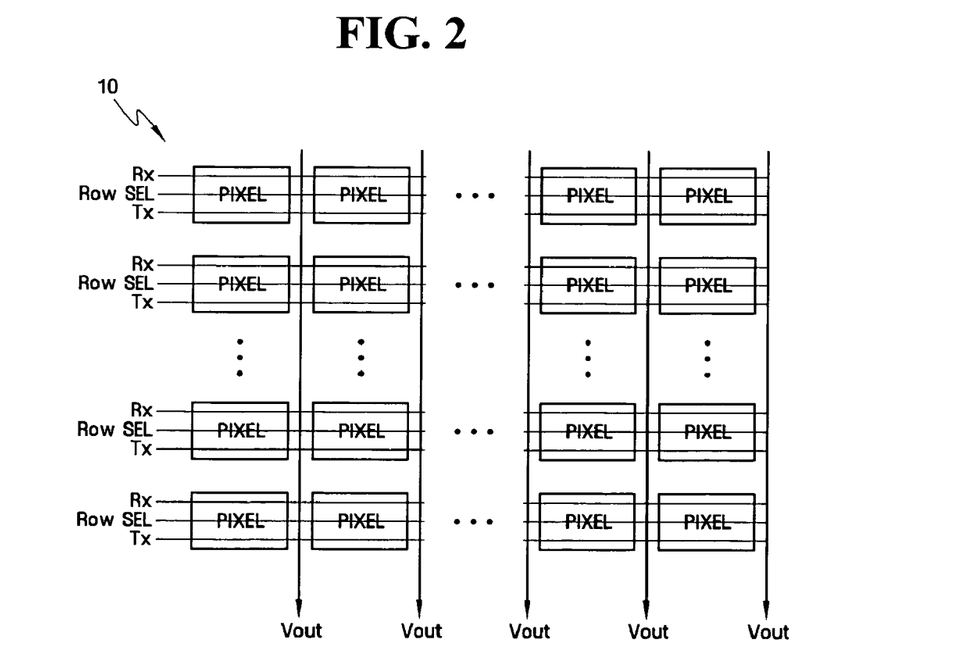
FIG. 2 is a schematic circuit diagram of an active pixel sensor (APS) array in an image sensor according to example embodiments.

FIG. 1 is a block diagram of a Complementary Metal Oxide Semiconductor (CMOS) image sensor containing unit pixels according to example embodiments, and FIG. 2 is a schematic circuit diagram of an active pixel sensor (APS) array in an image sensor containing unit pixels according to example embodiments.

Referring to FIG. 1, a CMOS image sensor may include an active pixel sensor (APS) array 10 and a logic region 20 for operating the APS array 10. The APS array 10 may include a plurality of unit pixels arranged in two dimensions, and each unit pixel may include a light-receiving element.

Referring to FIG. 2, the APS array 10 may include a plurality of unit pixels arranged in a two-dimensional array. The APS array 10 may consist of a plurality of unit pixels 100 configured, for example, as shown in the equivalent circuit diagram of FIG. 3, and the plurality of unit pixels 100 may be arranged in a matrix. The APS array 10 may convert optical signals into electrical signals and may receive a plurality of driving signals from a row driver 50, such as a pixel select signal SEL, a reset signal RX, and a charge transfer signal TX, so that the APS array 10 may be driven by the driving signals. The electrical signals may be provided to a Correlated Double Sampler (CDS) 60 through a vertical signal line.

Referring to FIG. 1, the logic region 20 may include a timing generator 30, a row decoder 40, a row driver 50, a CDS 60, an Analog to Digital Converter (ADC) 70, a latch 80, and/or a column decoder 90.

The timing generator 30 may provide timing signals and control signals to the row decoder 40 and the column decoder 90.

The row driver 50 may provide a plurality of driving signals that drive a plurality of unit pixels of the APS array 10 based on the results of decoding by the row decoder 50. When the unit pixels are arranged in the form of a matrix, driving signals may be provided for respective rows.

The CDS 60 may receive an electrical signal from the APS array 10 through the vertical signal line and may hold and/or sample the electrical signal. For example, the CDS 60 may perform double sampling on a specific noise level and a signal level of the generated electrical signal, and may output a difference level corresponding to the difference between the noise level and the signal level.

The ADC 70 may convert an analog signal corresponding to the difference level into a digital signal, and may output the digital signal.

The latch 80 may latch the digital signal and may sequentially output the latched signal to an image signal processor (not shown in FIG. 1) according to the result of decoding by the column decoder 90.

Figure 3:
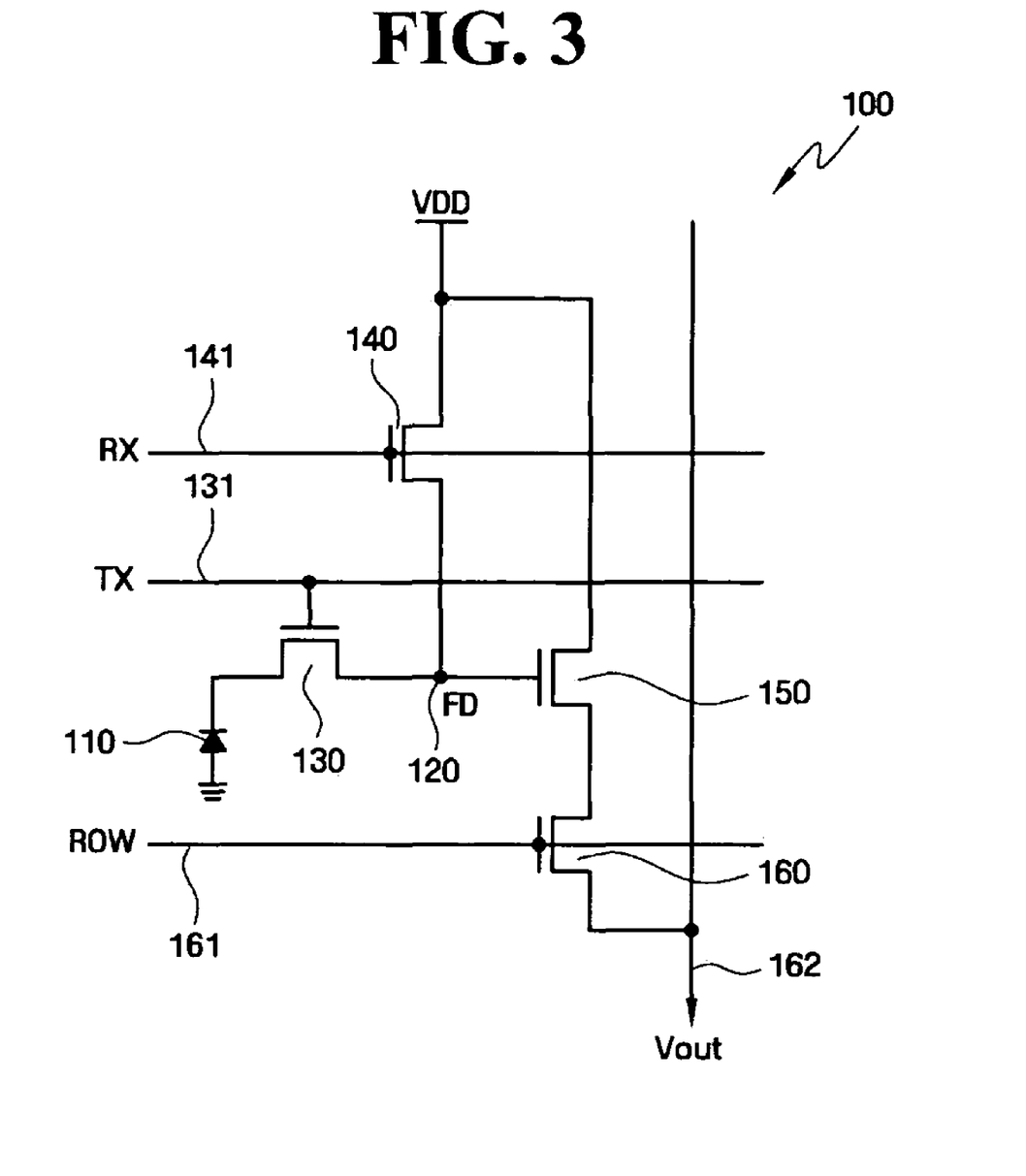
FIG. 3 is a circuit diagram of a unit pixel in an image sensor according to example embodiments.

FIG. 3 is a circuit diagram of a unit pixel in an image sensor according to example embodiments.

While FIG. 3 shows the unit pixel 100 including four transistors, the unit pixel 100 may have a photogate structure similar to a three-, five- or four-transistor structure, for example, or other structure containing a number of transistors.

Referring to FIG. 3, the four-transistor unit pixel 100 may include a light-receiving element 110 that receives light and generates and accumulates photocharges. The four-transistor unit pixel 100 may include a reading element that reads an optical signal incident on the light-receiving element 110. The reading element may include a reset gate 140, a drive gate 150, and a select gate 160.

For example, the light-receiving element 110 may generate and accumulate charges corresponding to the amount of incident light. Example embodiments of the light-receiving element 110 include a photodiode, a phototransistor, a photogate, a pinned photo diode (PPD), and any combination thereof. The light-receiving element 110 may be connected to a charge transfer gate 130 that passes accumulated photocharges to a floating diffusion (FD) region 120.

The FD region 120 may receive charges accumulated in the light-receiving element 110, and may store the charges. For example, the FD region 120 may cumulatively store the charges and may have parasitic capacitance. The FD region 120 may be electrically connected to the drive gate 150 and may control the drive gate 150.

The charge transfer gate 130 may transfer charges from the light-receiving element 110 to the FD region 120. For example, the charge transfer gate 130 may include one transistor and may be controlled by the charge transfer signal TX.

The reset gate 140 may periodically reset the FD region 120. The reset gate 140 may have a source and a drain separately connected to the FD region 120 and a power voltage Vdd. The reset gate 140 may be driven by a bias provided by a reset line 141. Thus, when the reset gate 140 is turned on by a bias provided by the reset line 141, the power voltage Vdd may be delivered to the FD region 120.

The drive gate 150 may act as a source follower buffer amplifier with a constant current source (not shown in FIG. 3) located outside the unit pixel 100. The drive gate 150 may amplify variations in electrical potential of the FD region 120 that has received photocharges, and may output the result to an output line.

The select gate 160 may select a unit pixel 100 to be read out for each row. The select gate 160 may be driven by a bias provided by a row select line ROW. When the select gate 160 is turned on, a power voltage connected to a drain of the select gate 160 may be passed to a drain of the drive gate 150.

The driving signal lines 131, 141 and 161 for the charge transfer gate 130, the reset gate 140, and the select gate 160 extend in the direction of rows (such as, but not limited to, a horizontal direction as shown in FIG. 3) so that unit pixels of the same row may be simultaneously driven.

Figure 4:
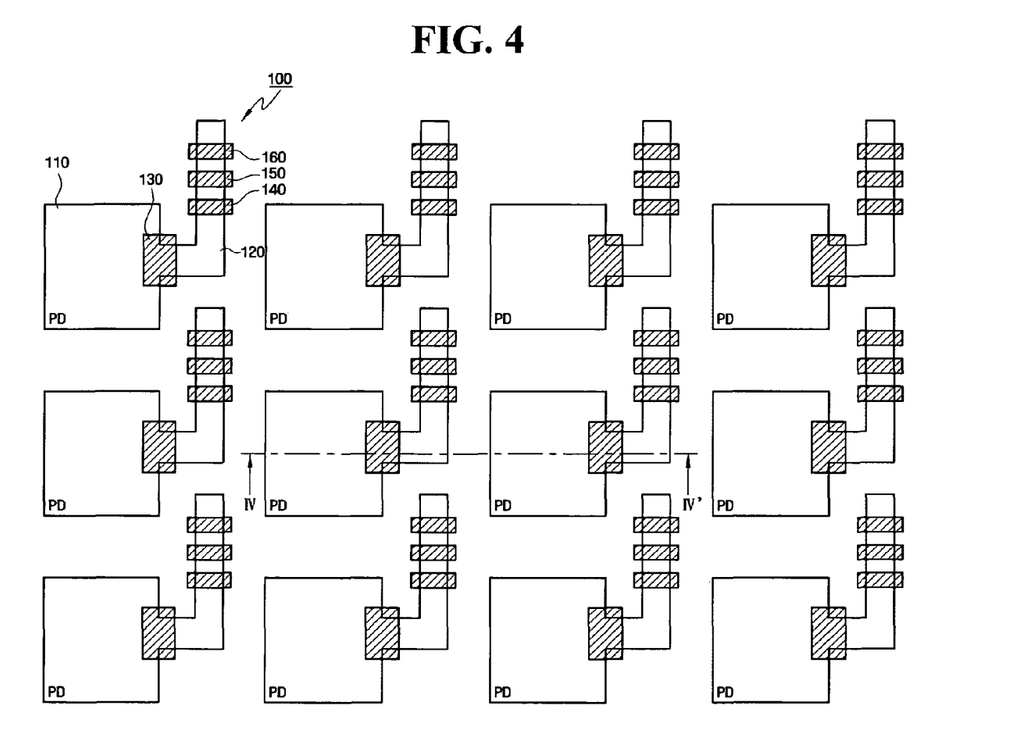
FIG. 4 is a plan view of an APS array in an image sensor according to example embodiments.

FIG. 4 is a plan view of an APS array in an image sensor according to example embodiments.

Referring to FIG. 4, the APS array (shown as reference numeral 10 in FIGS. 1 and 2) may include unit pixels arranged in a matrix, and a substrate may be divided into square unit pixels 100. Each unit pixel 100 may include a light-receiving element 110 located at the center, a FD region 120, a charge transfer gate 130, a reset gate 140, a drive gate 150 and a select gate 160 that are located around the light-receiving element 110.

Figure 5:
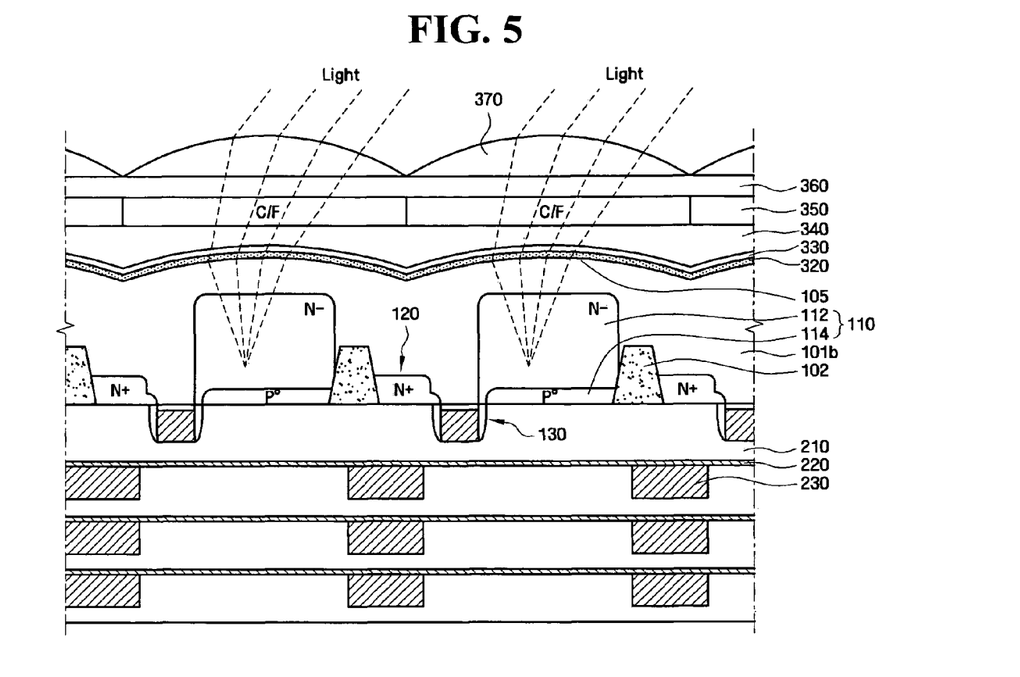
FIG. 5 is a cross-sectional view of unit pixels in the APS array of the image sensor of FIG. 4 according to example embodiments taken along line IV-IV'.

FIG. 5 is a cross-sectional view of unit pixels in the APS array in the image sensor of FIG. 4 taken along line IV-IV'.

Referring to FIG. 5, a unit pixel may be a backside illuminated device in which light is irradiated from the backside. For example, elements for transferring and reading out a light-receiving signal may be formed on the frontside of a semiconductor substrate 101b, and elements for receiving and transmitting light may be formed on the backside thereof.

The unit pixels may include the charge transfer gate 130, the reset gate (reference numeral 140 in FIG. 4), the drive gate (reference numeral 150 in FIG. 4), the select gate (reference numeral 160 in FIG. 4) and wiring layers 230 that are located on the frontside of the semiconductor substrate 101b. The unit pixels may include inner lenses 105, a color filter layer 350, and microlenses 370 that are located on the backside of semiconductor substrate 101b.

For example, an initial semiconductor substrate may include a P-type bulk silicon substrate and a P-type epitaxial layer formed on the P-type bulk silicon substrate. During manufacture of the unit pixels, the P-type bulk silicon substrate may be removed from the initial semiconductor substrate to form the semiconductor substrate 101b containing the remaining P-type epitaxial layer. The semiconductor substrate 101b may further include well regions.

In the structure of the unit pixels, although the semiconductor substrate 101b refers to the P-type epitaxial layer 101b, the semiconductor substrate 101b is not limited thereto and may be any of various types of substrates, such as a bulk silicon substrate. The semiconductor substrate 101b may have active regions defined by device isolation layers 102. For example, each device isolation layer 102 may be a Shallow Trench Isolation (STI) extending inward from the frontside of the semiconductor substrate 101b or a Field Oxide (FOX) formed using Local Oxidation of Silicon (LOCOS).

A plurality of transistors may be disposed on the front side of the semiconductor substrate 101b. The plurality of transistors may include a transfer gate 130, a reset gate 140, a drive gate 150, and a select gate 160.

The light-receiving element 110 may be disposed on one side of the transfer gate 130. For example, the light-receiving element 110 may be a PPD.

When the light-receiving element 110 is a PPD, the light-receiving element 110 may include N- and P-type photodiodes 112 and 114 formed by two ion implantations. The N-type photodiode 112 maybe formed deeply within the P-type epitaxial layer 101b, and the P-type photodiode 114 may be formed shallowly on a surface of the N-type photodiode 112.

Therefore, the light-receiving element 110 may have a PNP junction structure in which the semiconductor substrate 101b, the N-type photodiode 112, and the P-type photodiode 114 have been stacked.

The N-type photodiode 112 may absorb incident light and may accumulate photocharges. The P-type photodiode 114 may reduce thermally generated Electron-Hole Pairs (EHPs) and thereby may reduce the occurrence of dark current. The dark current may be caused by surface damage to the semiconductor substrate 101. Surface damage may result from silicon dangling bond defects or etching stress defects, for example. Holes of EHPs thermally generated from a surface of the P-type epitaxial layer 101b may diffuse to the grounded substrate 101 through the P-type photodiode 114 and electrons thereof may recombine with holes and be removed in the process of diffusing the P-type photodiode 114.

An FD region 120 may be spaced apart from the light-receiving element 110. The FD region 120 may receive photocharges accumulated in the light-receiving element 110. The FD region 120 may include low- and high-concentration impurity regions. For example, the FD region 120 may have a lightly doped drain (LDD) or double doped drain (DDD) structure.

The transfer gate 130 may be disposed on the semiconductor substrate 101 between the spaced-apart light-receiving element 110 and FD region 120, and may transfer charges accumulated in the light-receiving element 110 to the FD region 120.

The reset gate 140, the drive gate 150, and the select gate 160 may be separated from the transfer gate 130 and may be disposed in a spaced-apart manner on a portion of the semiconductor substrate 101 adjacent to the FD region 120.

The unit pixels may include a plurality of interlayer insulating layers 210 formed on the front side of the semiconductor substrate 101b, and may cover the entire surface of the semiconductor substrate 101b. Each of the plurality of interlayer insulating layers 210 may have a planarized top surface. Etch stop layers 220 may be formed between the plurality of interlayer insulating layers 210. A plurality of wiring layers 230 may be formed within each of the plurality of interlayer insulating layers 210. The plurality of wiring layers 230 may be made of metal, for example.

The unit pixels may include a plurality of inner lenses 105 disposed at positions on the backside of the semiconductor substrate 101b. The plurality of inner lenses 105 may correspond to the light-receiving elements 110 within the unit pixels 100. Each inner lens 105 may focus light incident to the backside of the semiconductor substrate 101b onto the center of a corresponding light-receiving element 110. The inner lenses 105 may be formed by patterning the backside of the semiconductor substrate 101b, and the backside of the semiconductor substrate 101b may have the form of a lens.

For example, the inner lenses 105 may be formed by patterning the silicon layer or silicon epitaxial layer in the semiconductor substrate 101b, without the need for a separate layer. The inner lenses 105 may be convexly curved away from the corresponding light-receiving elements 110 and may cover the entire top surfaces of the light-receiving elements 110.

The unit pixels may include a doped ion implantation layer 320 along the surfaces of the inner lenses 105 so as to reduce or remedy defects due to etching stress, interface traps, or silicon dangling bond defects on the backside of the semiconductor substrate 101b that may occur when the inner lenses 150 are formed by patterning the semiconductor substrate 101b. The ion implantation layer 320 may be formed by growing a silicon epitaxial layer on a portion of the backside of the semiconductor layer and doping impurities into the grown silicon epitaxial layer.

The ion implantation layer 320 may be formed by ion-implanting high concentration P-type impurities, such as boron, for example, so as to reduce dark current on the backside surface of the semiconductor substrate 101b. Thus, it may be possible to reduce or prevent creation of depletion wells due to an electrical potential drop on the backside surface of the semiconductor substrate 101b, which may be caused by damage to the backside surface.

The unit pixels may include an anti-reflective layer 330. The anti-reflective layer 330 may be conformally formed over the ion implantation layer 320 and may replicate the shape of the inner lenses 105. The anti-reflective layer 330 may prevent light incident on the backside of the semiconductor substrate 101b from being reflected from the inner lenses 105.

The unit pixels may include a lower planarizing layer 340 that planarizes a top surface of the anti-reflective layer 330. The lower planarizing layer 340 may be made of a material such as thermosetting resin that may transmit light incident onto the backside of the semiconductor substrate 101b.

The color filter layer 350 may be formed on the lower planarizing layer 340 corresponding to each of the plurality of light-receiving elements 110. For example, the color filter layer 350 may include a plurality of color filters arranged in a matrix at positions corresponding to the plurality of light-receiving elements 110. In order to obtain images, the color filter layer 350 may transmit a light beam of a given color so that the light beam can reach the light-receiving elements 110. The color filter layer 350 may include red (R), green (G), and blue (B) color filters arranged in a Bayer pattern, for example.

Microlenses 370 may be disposed above the color filter layer 350 and may correspond to the plurality of light-receiving elements 110. The microlens 370 may change the path of light incident on an area other than the light-receiving element 110 such that the light may be focused onto the light-receiving element 110.

An upper planarizing layer 360 called an Over-Coating Layer (OCL) may be formed using thermosetting resin between the color filter layer 350 and the microlenses 370.

Accordingly, light incident on the backside of the semiconductor substrate 101b may pass through the microlenses 370, the color filter layer 350, and the inner lenses 105, and may reach the light-receiving elements 110. There may be a given distance between the microlens 370, onto which light is incident, and the light-receiving element 110, and it may possible to reduce the amount of incident light lost prior to reaching the light-receiving element 110.

Light incident on an edge of the microlens 370 or obliquely incident may be refracted again by the inner lens 105 before entering the light-receiving element 110, and the amount of light lost prior to reaching the light-receiving element 110 may be reduced, thus improving photosensitivity of the image sensor.

A method of fabricating unit pixels according to example embodiments will now be described with reference to FIGS. 6 through 12. FIGS. 6 through 12 are cross-sectional views illustrating a method of fabricating unit pixels according to example embodiments.

Figure 6:
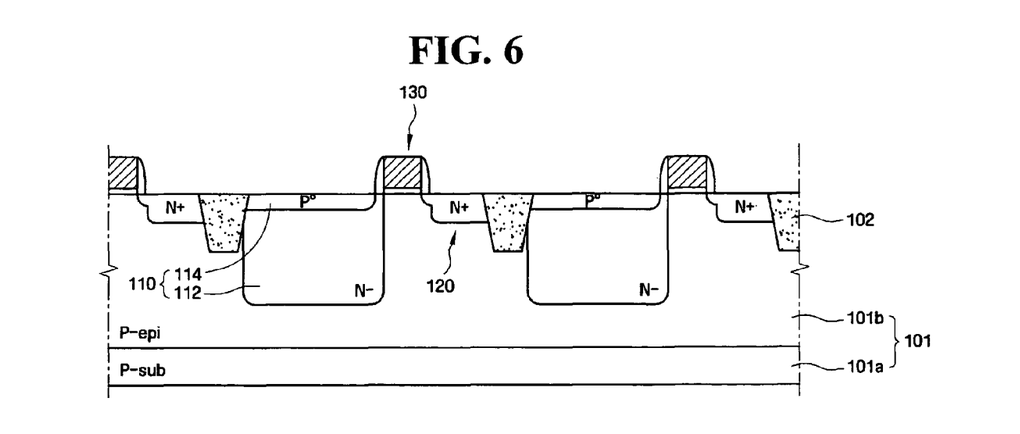
FIGS. 6 through 12 are cross-sectional views illustrating a method of fabricating unit pixels according to example embodiments.

First, referring to FIG. 6, a semiconductor substrate 101 may be prepared. The substrate 101 may include a P-type bulk substrate 101a and a P-type epitaxial layer 101b formed on the P-type bulk substrate 101a. A side on which the P-type epitaxial layer 101b is formed and a side on which the P-type substrate 101a is formed may be defined as a frontside and a backside, respectively. Then, P-type impurities may be ion-implanted into the P-type epitaxial layer 101b to form a P-type deep well (not shown in FIG. 6).

A LOCOS or STI process may be performed on the frontside of the semiconductor substrate 101 to form a device isolation layer 102, thus defining a field region and an active region.

Subsequently, a plurality of transistors may be formed on the frontside of the semiconductor substrate 101.

A gate insulating layer and a gate conductive layer may be sequentially formed over the frontside of the semiconductor substrate 101. The gate insulating layer may be formed of $SiO_2$, SiON, SiN, $Al_2O_3$, $Si_3N_4$, $Ge_xO_yN_z$, $Ge_xSi_yO_z$, or a material with a high dielectric constant (k). The high dielectric constant material may be formed by depositing $HfO_2$, $ZrO_2$, $Al_2O_3$, $Ta_2O_5$, HfSc, ZrSc, or any combination thereof using Atomic Layer Deposition (ALD). The gate insulating layer may have a stack of multiple films made of two or more of the above materials. The gate conductive layer may be formed by depositing a polysilicon layer.

The stacked gate insulating layer and gate conductive layer may be patterned to form a plurality of gates on the semiconductor substrate 101. For example, the charge transfer gate 130, the reset gate 140, the drive gate 150, and the select gate 160 may be formed on the semiconductor substrate 101.

A light-receiving element 110 may be formed within a portion of the semiconductor substrate 101 on one side of a transfer gate 130. The light-receiving element 110 may be a PPD formed within the P-type epitaxial layer 101b, for example.

A first mask pattern (not shown in FIG. 6), exposing a region on which the light-receiving element (PPD) 110 will be formed, may be formed over the frontside of the semiconductor substrate 101. N-type impurities may be ion-implanted into the semiconductor substrate 101 using the first mask pattern to form an N-type photodiode 112. During formation of the N-type photodiode 112, the N-type impurities may be tilted towards a transfer gate 130 at an angle of 0° to 15° for oblique ion implantation, and a portion of the N-type photodiode 112 may at least partially overlap the transfer gate 130.

After forming the N-type photodiodes 112, P-type impurities may be implanted using the first mask pattern to form a doped P-type photodiode 114 on the N-type photodiode 112. During formation of the P-type photodiode 114, the P-type impurities may be tilted towards the device isolation layer 102 at an angle of above 0° for oblique ion implantation. The P-type photodiode 114 may function to reduce EHPs thermally generated at the surface of the P-type epitaxial layer 101b, and the occurrence of dark current may thereby be reduced.

After forming the light-receiving element 110, the first mask pattern may be removed. While in the above-described example embodiment the light-receiving element 110 is formed after the formation of the plurality of transfer gates 130, the order of forming the light-receiving element 110 and the transfer gates 130 may vary.

Spacers may be formed on either side of each of the plurality of transfer gates 130. The spacers may be formed by conformally depositing an insulating layer for a spacer along the surfaces of the semiconductor substrate 101 and the transfer gates 130, and performing anisotropic etching on the insulating layer for a spacer. When an FD region 120 having an LDD structure is formed on the other side of each of the plurality of transfer gates 130, a lower concentration impurity region may be formed prior to forming the spacers.

Subsequently, a second mask pattern (not shown in FIG. 6) covering the light-receiving element 110 may be formed, followed by formation of the FD regions 120 on either side of each of the plurality of gates within the semiconductor substrate 101. The FD regions 120 may be formed by doping N-type impurities having the same conductivity type as the N-type photodiode 112 using the second mask pattern. Source/drain regions of the reset gate 140, the drive gate 150, and the select gate 160 may be formed, and this may occur simultaneously with the forming of the FD regions 120.

After forming the FD regions 120, the second mask pattern for ion implantation may be removed, and the APS array (reference numeral 10 in FIG. 1) including the light-receiving elements 110, the FD regions 120, the charge transfer gates 130, the reset gates 140, and the select gates 160 may be completed.

Figure 7:
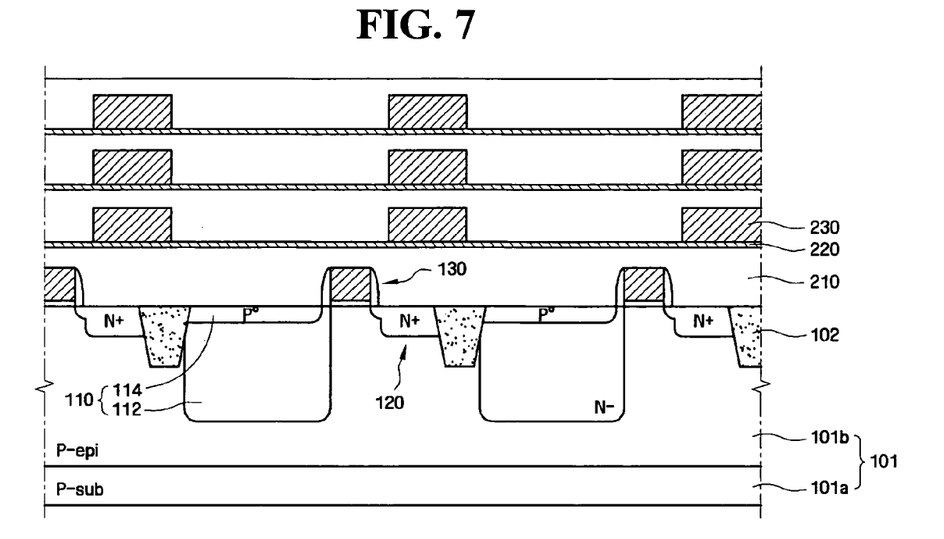

Referring to FIG. 7, an interlayer insulating layer 210 having a multi-stacked structure and wiring layers 230 may be formed over the frontside of the semiconductor substrate 101 on which the APS array 10 has been formed. An etch stop layer 220 may be formed between the plurality of interlayer insulating layers 210.

The interlayer insulating layers 210 may be formed of a material having desirable gap fill characteristics and a planarized top surface. For example, the interlayer insulating layer 210 may be formed of High Density Plasma (HDP), Tonen SilaZene (TOSZ), Spin On Glass (SOG), or Undoped Silica Glass (USG). The etch stop layer 220 may be formed of silicon nitride.

After sequentially forming the interlayer insulating layer 210 and the etch stop layer 220, a conductive material may be deposited over the etch stop layer 220 and patterned to form the wiring layers 230. The conductive material may be metal such as copper (Cu) and aluminum (Al). The wiring layer 230 overlying the interlayer insulating layer 210 may be connected to underlying elements or another wiring layer through a contact. Various modifications or changes may be made to arrangement structure of the wiring layers 230 for light blocking and/or electrical routing between elements of the APS array (reference numeral 10 in FIG. 1). Description of such modifications will not be given in order to avoid ambiguity in the example embodiments illustrated herein.

After forming the multi-layered interlayer insulating layer 210, the etch stop layer 220, and the wiring layers 230, the interlayer insulating layer 210 may be formed to cover the uppermost wiring layers 230 and then planarized.

Figure 8:
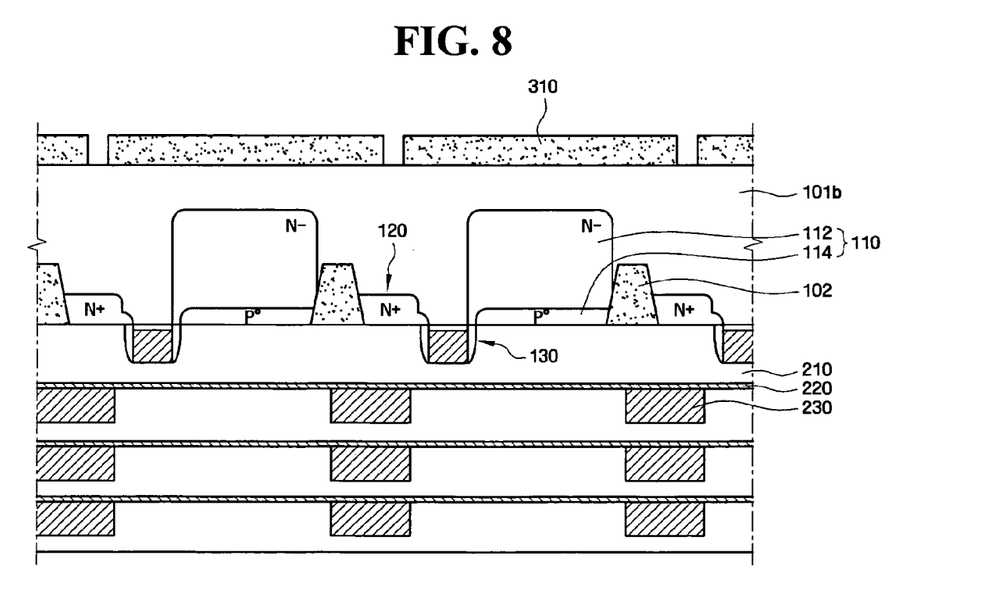

Referring to FIG. 8, the structure illustrated in FIG. 7 may be inverted so that the light-receiving elements 110 are located above the wiring layers 230. The backside of the semiconductor substrate 101 may then be ground to a given thickness.

In order to grind the backside of the semiconductor substrate 101, a silicon support layer (not shown in FIG. 8) may be formed over the uppermost interlayer insulating layer 210 before the semiconductor substrate 101 is inverted upside down. For example, another semiconductor substrate (not shown in FIG. 8) may be attached onto the uppermost interlayer insulating layer 210 so as to support the frontside of the semiconductor substrate 101.

Then, the positions of the upper and lower parts of the semiconductor substrate 101 may be reversed and the backside of the semiconductor substrate 101 may be ground to a given thickness using a chemical mechanical polishing (CMP) process. Wet etching may be performed to remove at least some contaminants from the ground backside of the semiconductor substrate 101. By doing so, the P-type bulk substrate 101b may be removed from the semiconductor substrate 101 consisting of the P-type bulk substrate 101a and the P-type epitaxial layer 101b, and only the P-type epitaxial layer 101b may substantially remain.

Grinding the backside of the semiconductor substrate 101 in the manner described above may reduce the thickness of the semiconductor substrate 101 on which light is incident, and thus may improve the photosensitivity of the light-receiving elements 110.

Hereinafter, a substrate on which only the P-type epitaxial layer 101b remains after grinding the backside of the semiconductor substrate 101 to a given thickness is defined as the semiconductor substrate 101b, but the semiconductor substrate 101b is not limited to an epitaxial layer.

A mask layer may be formed over the backside of the ground semiconductor substrate 101b, and may be patterned to form mask patterns 310 corresponding to the plurality of light-receiving elements 110, so that the mask patterns 310 may partially or completely cover the top surfaces of the light-receiving elements 110. The mask layer may be formed of an organic polymer compound such as photoresist (PR), for example.

Figure 9:
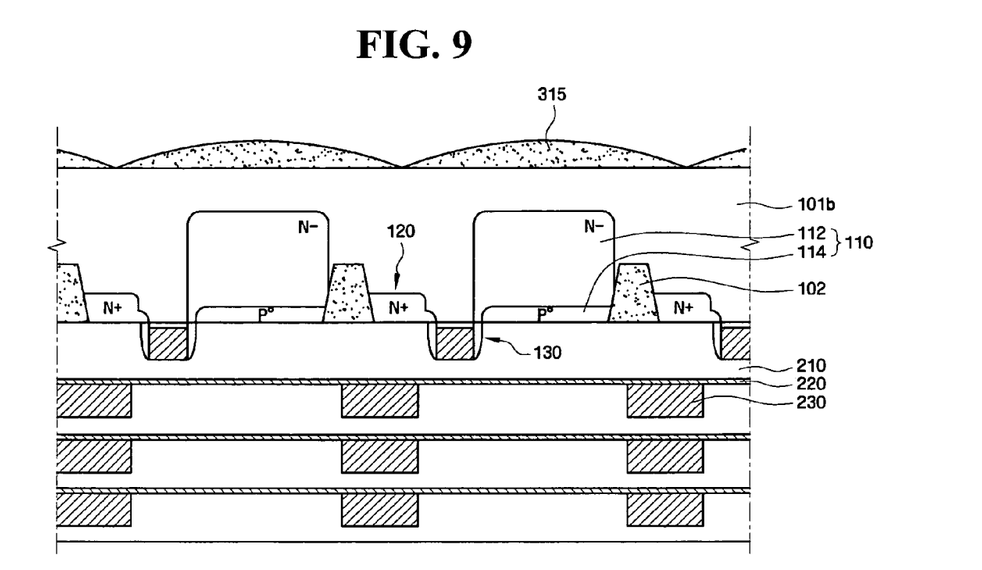

Referring to FIG. 9, the mask patterns 310 formed on the backside of the semiconductor substrate 101b may be reflowed to make hemispherical mask patterns 315 having a given curvature. The hemispherical mask patterns 315 may be convexly curved away from the backside of the semiconductor substrate 101b. The curvature of the hemispherical mask patterns 315 may be adjusted by changing the temperature and time during a reflow process.

Anisotropic etching may be performed on the backside of the semiconductor substrate 101b using the hemispherical mask pattern 315 as an etch mask. The hemispherical mask pattern 315 and the semiconductor substrate 101b may be anisotropically etched with a given etching selectivity or no etching selectivity between the hemispherical mask pattern 315 and the semiconductor substrate 101b so that the hemispherical shape of the mask pattern 315 can be transferred to the backside of the semiconductor substrate 101b.

Figure 10:
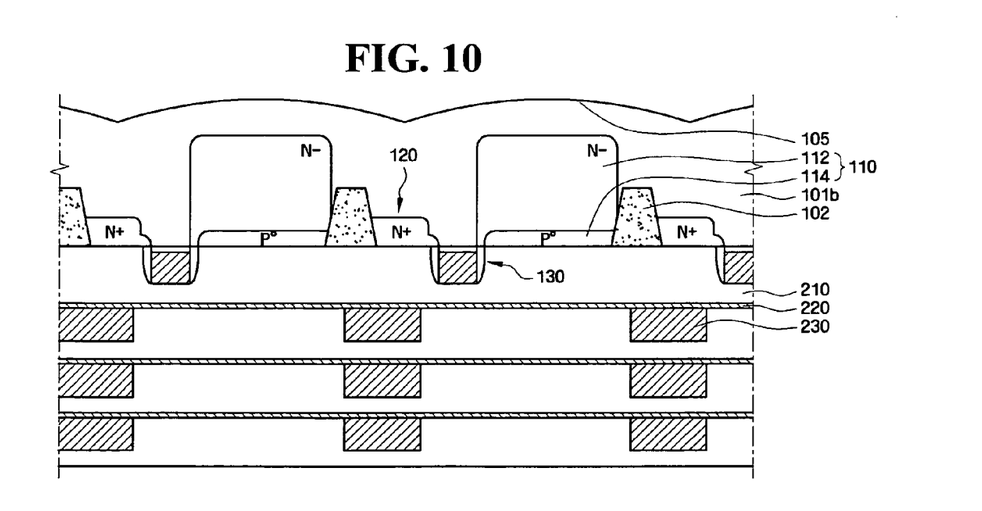

Referring to FIG. 10, anisotropic etching may be performed to remove the hemispherical mask patterns 315 and form convexly curved inner lenses 105 at positions on the backside of the semiconductor substrate 101b. For example, the inner lens 105 may be formed of a semiconductor material such as silicon film or epitaxial film. The curvature of the inner lens 105 may be adjusted according to etching selectivity during etch of the semiconductor substrate 101b.

As described above, the inner lenses 105 may be formed by patterning the semiconductor substrate 101b using the hemispherical mask pattern 315, without the need to form a separate layer on the backside of the semiconductor substrate 101b. Thus, the process of forming the inner lenses 105 may be simplified.

Figure 11:
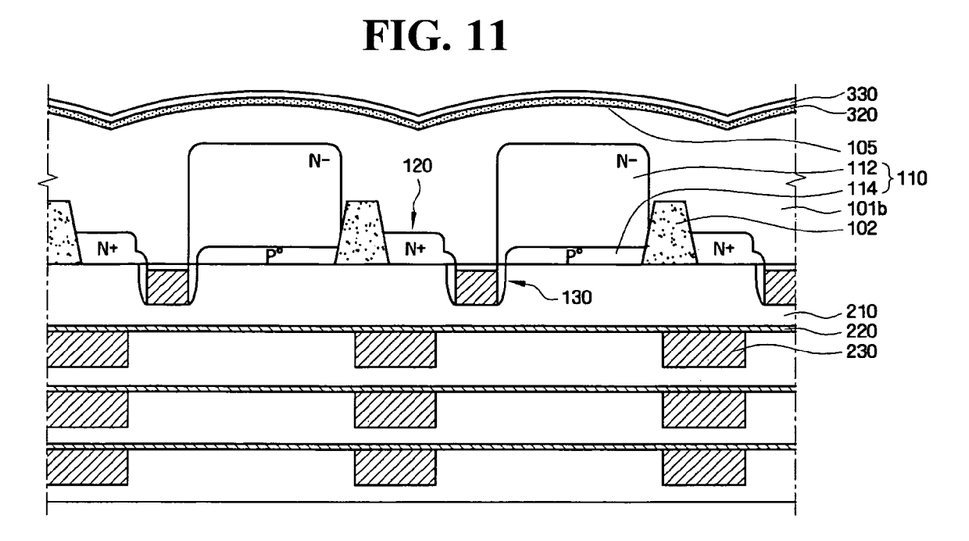

Referring to FIG. 11, a backside treatment may be performed to reduce or remedy defects that occur in the process of forming the inner lenses 105 by etching the semiconductor substrate 101b.

An ion implantation layer 320 may be doped along the surface of the semiconductor substrate 101b on which the inner lenses 105 have been formed. The ion implantation layer 320 may be formed by doping higher concentration P-type impurities so as to suppress silicon dangling bond defects on the backside of the semiconductor substrate 101b, surface damage due to etching stress, or interface traps. By forming the ion implantation layer 320, it may be possible to reduce or prevent the creation of depletion wells due to an electrical potential drop on the backside surface of the semiconductor substrate 101b. Thus, dark current in the light-receiving elements 110 may be reduced.

After doping the impurities into the backside of the semiconductor substrate 101b, a heat treatment may be performed to activate the doped impurities. For example, rapid thermal annealing (RTA) may be performed at a lower temperature, such as below 400° C.

The ion implantation layer 320 may also be formed by conformally growing an epitaxial layer on the backside of the semiconductor substrate 101b using molecular beam epitaxy (MBE), and ion-implanting impurities into the grown epitaxial layer.

An anti-reflective layer 330 may be formed conformally over the ion implantation layer 320 to replicate the shape of the inner lenses 105. The anti-reflective layer 330 may prevent light incident into the backside of the semiconductor substrate 101b from being reflected from the inner lenses 105 without being incident into the semiconductor substrate 101b.

Figure 12:
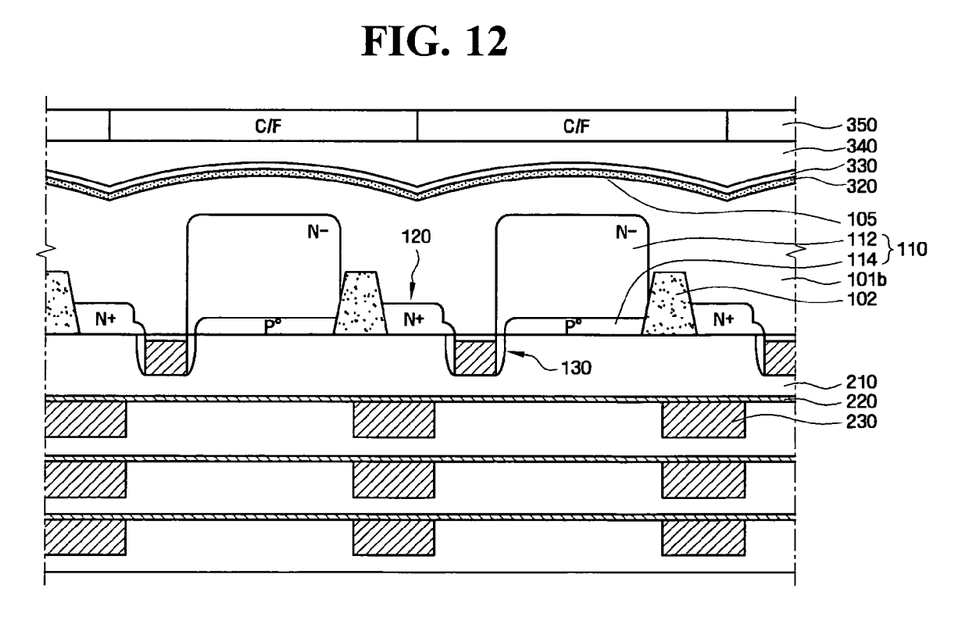

Referring to FIG. 12, a lower planarizing layer 340 may be formed on the anti-reflective layer 330 so as to reduce or eliminate a step difference on the backside of the semiconductor substrate 101b caused by the inner lenses 105. The lower planarizing layer 340 may also reduce or prevent corrosion of underlying elements due to the use of dye during subsequent formation of color filters. The lower planarizing layer 340 may be made of a highly light-transmissive polyimide or polyacryl based material, for example.

The color filter layer 350 may be formed over the lower planarizing layer 340, and may transmit a light beam of a specific color to obtain images so that the light beam can reach the light-receiving elements 110. The color filter layer 350 may be formed using dying, pigment dispersion, or printing, for example. The color filter layer 350 may be mostly made of dyed photoresist. Each color filter may let through one of the three colors red, green, and blue, and each color filter may be formed at a position corresponding to each of the plurality of light-receiving elements 110.

Referring to FIG. 5, an upper planarizing layer 360 may be formed on the color filter layer 350 using a highly light-transmissive polyimide or polyacryl based material, for example.

Microlenses 370 may be subsequently formed on the upper planarizing layer 360 and may correspond to the plurality of light-receiving elements 110. The patterns may be formed so as to cover each of the plurality of light-receiving elements 110 using light-transmissive photoresist and may be reflowed to form convexly curved microlenses 370 having a given curvature on the upper planarizing layer 360.

Then materials remaining on the surface of the microlenses 370 may be removed. A baking step may be performed to maintain the shape of the microlenses 370.

According to example embodiments of a method of fabricating a unit pixel, light-transmissive elements such as inner lenses 105, the color filter layer 350, and the microlenses 370 may be formed on the backside of the semiconductor substrate 101b so that light is incident into the backside, thus reducing loss of light incident on the light-receiving elements 110.

A unit pixel according to example embodiments may allow incident light to be focused onto the light-receiving element 110 through the microlens 370 and the inner lens 105 when the light is incident into the backside of the semiconductor substrate 101b, thus further reducing the amount of light lost. Example embodiments provide that the inner lenses 105 may be formed by patterning the backside of the semiconductor substrate 101b, and that it may not be necessary to form a separate inner lens layer. Thus, the unit pixel may be fabricated in a simplified manner.

Example embodiments provide that light-transmissive elements such as the inner lenses, the color filter layer, and the microlenses may be formed on the backside of the semiconductor substrate 101b, and that the distance between the light-receiving element and the microlens on which the light is incident may be reduced. Thus, the length of the path of the incident light may be reduced, thereby decreasing the amount of light lost.

Example embodiments provide that light incident on the backside of the semiconductor substrate may be focused on the light-receiving element through microlenses and inner lenses, and thus loss in the amount of light obliquely entering the microlens may be further reduced. The inner lens may be formed by patterning the backside of the semiconductor substrate, and it may not be necessary to form a separate inner lens layer. Thus, the unit pixel may be fabricated in a more simplified manner.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A unit pixel comprising:
a semiconductor substrate,
a photoelectric transducer within the semiconductor substrate, multi-layered wiring layers on a frontside of the semiconductor substrate,
an inner lens corresponding to the photoelectric transducer on a backside of the semiconductor substrate, and
a microlens above the inner lens,
wherein the semiconductor substrate is patterned to form the inner lens.

2. The unit pixel as claimed in claim 1, wherein the inner lens is convexly curved away from the backside of the semiconductor substrate.

3. The unit pixel as claimed in claim 1, wherein the semiconductor substrate includes an epitaxial layer.

4. The unit pixel as claimed in claim 1, further comprising a doped high concentration ion implantation layer along the backside of the semiconductor substrate.

5. The unit pixel as claimed in claim 1, further comprising an anti-reflective layer on the inner lens.

6. The unit pixel as claimed in claim 1, further comprising a planarizing layer between the inner lens and the microlens.

7. The unit pixel as claimed in claim 1, further comprising a color filter layer corresponding to the photoelectric transducers between the inner lens and the microlens.

8. An image sensor, comprising:
an active pixel array including a plurality of unit pixels as claimed in claim 1, and a logic region.

9. The image sensor as claimed in claim 8, wherein the plurality of unit pixels are arranged in two dimensions.

10. The image sensor as claimed in claim 8, wherein the logic region comprises:
a timing generator,
a row decoder,
a row driver,
a correlated double sampler,
an analog to digital converter,
a latch, and
a column decoder,
wherein the timing generator is configured to provide timing and control signals to the row decoder and the column decoder,
wherein the row driver is configured to provide a plurality of driving signals to the active pixel array,
wherein the correlated double sampler is configured to receive an electrical signal from the active pixel array, sample the electrical signal, and output an analog signal,
wherein the analog to digital converter is configured to convert the analog signal outputted by the correlated double sampler into a digital signal and output the digital signal, and
wherein the latch is configured to latch the digital signal output by the analog to digital converter and output the latched signal according to a signal from the column decoder.

11. The image sensor as claimed in claim 10, wherein the plurality of driving signals includes a pixel select signal, a reset signal, and a charge transfer signal.

12. A unit pixel comprising:
a semiconductor substrate,
a photoelectric transducer within the semiconductor substrate, multi-layered wiring layers on a frontside of the semiconductor substrate,
an inner lens corresponding to the photoelectric transducer on a backside of the semiconductor substrate, and
a microlens above the inner lens, and
an anti-reflective layer on the inner lens.

13. A unit pixel comprising:
a semiconductor substrate,
a photoelectric transducer within the semiconductor substrate, multi-layered wiring layers on a frontside of the semiconductor substrate,
an inner lens corresponding to the photoelectric transducer on a backside of the semiconductor substrate, and
a microlens above the inner lens, and
a doped high concentration ion implantation layer along the backside of the semiconductor substrate.

14. A method of fabricating a unit pixel, comprising:
providing a semiconductor substrate,
forming a photoelectric transducer within the semiconductor substrate,
forming wiring layers with a multi-stacked structure on a frontside of the semiconductor substrate,
forming an inner lens corresponding to the photoelectric transducer on a backside of the semiconductor substrate, and
forming a microlens above the inner lens,
wherein the semiconductor substrate is patterned to form the inner lens.

15. The method as claimed in claim 14, wherein the semiconductor substrate includes a bulk substrate and an epitaxial layer.

16. The method as claimed in claim 15, further comprising grinding a portion of the backside of the semiconductor substrate after forming the wiring layers.

17. The method as claimed in claim 16, wherein the backside of the semiconductor substrate is ground so that only the epitaxial layer remains on the semiconductor substrate.

18. The method as claimed in claim 14, wherein forming the inner lenses comprises:
forming at least one hemispherical mask pattern corresponding to the photoelectric transducer on the backside of the semiconductor substrate, and
transferring the at least one hemispherical mask pattern to the backside of the semiconductor substrate.

19. The method as claimed in claim 18, wherein forming the at least one hemispherical mask pattern comprises:
forming a mask layer on the backside of the semiconductor substrate,
patterning the mask layer to form at least one mask pattern corresponding to the photoelectric transducer, and
reflowing the at least one mask pattern.

20. The method as claimed in claim 18, wherein forming the inner lens comprises performing anisotropic etching on the backside of the semiconductor substrate with no etching selectivity between the at least one hemispherical mask pattern and the semiconductor substrate.

21. The method as claimed in claim 14, further comprising forming a doped high concentration ion implantation layer along the backside of the semiconductor substrate after forming the inner lens.

22. The method as claimed in claim 14, further comprising forming an anti-reflective layer on the inner lens.

23. The method as claimed in claim 14, further comprising forming a planarizing layer between the inner lens and the microlens.

24. The method as claimed in claim 14, further comprising forming a color filter layer corresponding to the photoelectric transducer between the inner lens and the microlens.

* * * * *